United States Patent
Hallock et al.

(10) Patent No.: US 6,524,936 B2
(45) Date of Patent: Feb. 25, 2003

(54) PROCESS FOR REMOVAL OF PHOTORESIST AFTER POST ION IMPLANTATION

(75) Inventors: John Scott Hallock, Potomac, MD (US); Alan Frederick Becknell, Ellicott City, MD (US); Palani Sakthivel, Gaithersburg, MD (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 09/742,721

(22) Filed: Dec. 22, 2000

(65) Prior Publication Data

US 2002/0151156 A1 Oct. 17, 2002

(51) Int. Cl.[7] .............................................. H01L 21/425
(52) U.S. Cl. ......................... 438/531; 156/345; 156/656
(58) Field of Search ................................ 156/345, 656, 156/643; 134/1; 216/87; 438/531

(56) References Cited

U.S. PATENT DOCUMENTS

| 4,341,592 | A | * | 7/1982 | Shortes et al. .............. 156/643 |
| 4,885,047 | A | * | 12/1989 | Ury et al. .................... 156/345 |
| 4,938,839 | A | | 7/1990 | Fujimura et al. |
| 5,346,586 | A | * | 9/1994 | Keller ......................... 156/656 |
| 5,647,946 | A | * | 7/1997 | Belcher et al. ............. 156/345 |
| 5,746,930 | A | * | 5/1998 | Belcher et al. ................ 216/87 |
| 5,792,377 | A | * | 8/1998 | Belcher et al. ................ 216/87 |
| 5,811,358 | A | | 9/1998 | Tseng et al. |
| 5,954,884 | A | * | 9/1999 | Lawing et al. .................. 134/1 |
| 6,024,887 | A | | 2/2000 | Kuo et al. |
| 6,183,566 | B1 | * | 2/2001 | Lawing et al. .................. 134/1 |
| 6,334,856 | B1 | * | 1/2002 | Allen et al. ................... 604/191 |

* cited by examiner

Primary Examiner—John F. Niebling
Assistant Examiner—Olvia Luk
(74) Attorney, Agent, or Firm—Watts, Hoffmann, Fisher & Heinke Co., L.P.A.

(57) ABSTRACT

A process for stripping a photoresist layer after exposure to an ion implantation process. The process includes subjecting a substrate having the ion implanted photoresist layer thereon to a UV radiation exposure and subsequently removing the ion implanted photoresist by conventional stripping processes.

43 Claims, 3 Drawing Sheets

PROCESS FOR REMOVAL OF PHOTORESIST AFTER POST ION IMPLANTATION

FIELD OF THE INVENTION

The present invention relates to a process for stripping photoresist from a substrate. More specifically, the invention relates to processes for removing a layer of photoresist after an ion implantation process is performed.

BACKGROUND OF THE INVENTION

Fabrication of integrated circuits includes numerous processes. Ion implantation is one such process commonly used in the manufacture of integrated circuits wherein dopant ions are selectively implanted through an organic photoresist mask into a surface of the semiconductor substrate. The organic photoresist mask, typically cast from solvent, is patterned using photolithography processes. Once the ion implantation process is complete, the photoresist mask is typically removed by a stripping process. However, during the ion implantation process, the dopant ions react with a surface of the photoresist to create what is commonly referred to by those skilled in the art as a "crust portion". The resulting crust portion is relatively nonporous and is difficult to subsequently remove using conventional stripping processes. The presence of a crust in the photoresist layer deleteriously affects post ion implantation processing. For instance, it has been found that the crust portion does not allow trapped volatile solvents or low molecular weight polymers within the photoresist layer to escape easily as the wafer temperature is raised during dry stripping processes. As a result, plasma stripping of the photoresist layer may cause blistering or popping at elevated temperatures, which in turn causes defects and particles to be generated. The term "elevated temperatures" refers to those temperatures greater than the maximum temperature the photoresist layer had previously been baked or subjected to prior to the implantation process. Stripping ion implanted photoresist using conventional wet chemical strippers requires longer throughputs since the dissolution behavior of the crust portion requires longer contact time with the strippers. Moreover, the dissolution behavior of the crust portion is not very uniform.

Various methods have been disclosed in the art for removing photoresist layers from substrates that have been exposed to an ion implantation process. For example, Fujimura et al., in U.S. Pat. No. 4,938,839, describe a method that employs cooling the substrate while the ion implanted patterned photoresist layer is stripped from the substrate with a plasma of an etchant gas comprising oxygen. Cooling the wafer during stripping decreases the photoresist stripping rate thereby resulting in longer throughput.

Multiple and complicated plasma process steps have also been attempted but require careful monitoring to determine removal of the crust portion of the photoresist layer. In U.S. Pat. No. 5,811,358 to Tseng et al., the inventors disclose a three step method for stripping photoresist after high dose ion implantation. The crust portion of the ion implanted photoresist is first stripped with an oxygen and nitrogen/hydrogen plasma at a low temperature (<220° C.) to minimize or prevent the above noted blistering and/or popping problem. Then, a higher temperature (>220° C.) is employed to remove the remaining photoresist. Finally, the substrate is then cleaned with ammonium hydroxide and hydrogen peroxide to remove remaining contaminant and photoresist residues. This type of multi-step process requires different modules and equipment sets thereby decreasing wafer throughput and increases manufacturing costs.

Kuo et al., in U.S. Pat. No. 6,024,887, disclose a process for stripping ion implanted photoresist by first exposing the ion implanted resist layer with a first plasma generated from oxygen and fluorine gases. A second plasma, without fluorine containing species, is used to strip the ion implanted photoresist. Again, careful monitoring is required to determine removal of the crust layer.

In view of the prior art, it is desired to have a simple stripping process for removing the photoresist mask layer after exposure to a post ion implantation process. Preferably, the stripping process for the ion implanted photoresist requires minimal monitoring, is amenable to high throughput processing and is adaptable to both wet and dry stripping processes.

SUMMARY OF THE INVENTION

The present invention overcomes the prior art problems for removing a layer of photoresist after an ion implantation process is performed. The inventive processes have in common the step of subjecting a substrate having an ion implanted photoresist layer thereon to an ultraviolet radiation (UV) exposure. The step of exposing the substrate to UV radiation is after ion implantation and prior to photoresist removal from the substrate. The ion implanted photoresist layer is subsequently stripped or removed using conventional wet or dry stripping processes. In the case of dry stripping, the inventors have surprisingly found that blistering and/or popping problem noted in the prior art is minimized and advantageously, that higher stripping temperatures can be used for the dry stripping processes. In the case of wet stripping, removal efficiency is increased.

The inventive processes for removing ion implanted photoresist includes a step of exposing a substrate having an ion implanted photoresist layer thereon to an ultraviolet radiation source sufficient to render said photoresist layer removable and stripping the photoresist from the substrate. The ultraviolet radiation source preferably emits radiation at a wavelength from between about 150 nm to about 450 nm. More preferably, the ultraviolet radiation source emits radiation at a wavelength from between about 200 nm to about 400 nm. The substrate is exposed to an exposure energy dose of ultraviolet radiation from about 10 mJ/cm$^2$ to about 100 J/cm$^2$. Preferably, the exposure energy dose at the substrate surface is at least 100 mJ/cm$^2$. The time for exposing the substrate is variable and dependent on, among others, the ultraviolet exposure source. Optionally, the substrate may be heated during UV exposure to increase a rate for removing the photoresist mask from the substrate. In the event the substrate is heated, the temperatures used should not be greater than the maximum temperature the photoresist layer had been baked prior to the step of exposure to ultraviolet radiation. Preferably, the temperature range is from about 20° C. to about 120° C.

The inventive process can be practiced in in a separate module having therein the UV exposure source or in the same chamber as the plasma stripping process that has been adapted to have a UV exposure source.

Other embodiments of the invention are contemplated to provide particular features and structural variants of the basic elements. The specific embodiments referred to as well as possible variations and the various features and advantages of the invention will become better understood when considered in connection with the detailed description and drawings that follows.

DETAILED DESCRIPTION OF PREFERRED EMBODIMENTS

Figure 1A:
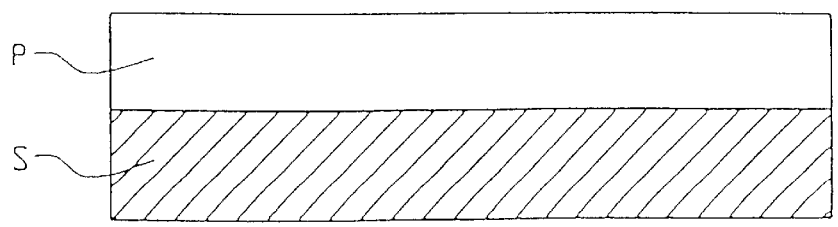
FIG. 1 is a schematic showing the steps of a process for removing ion implanted photoresist from a substrate in accordance with the present invention.
Figure 1B:
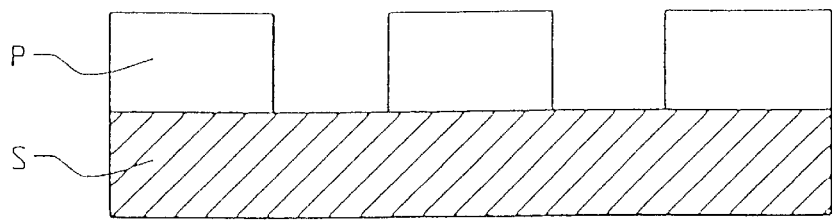
Figure 1C:
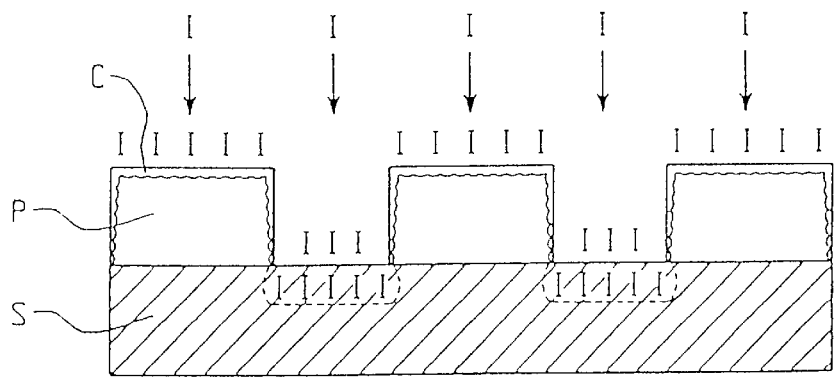
Figure 1D:
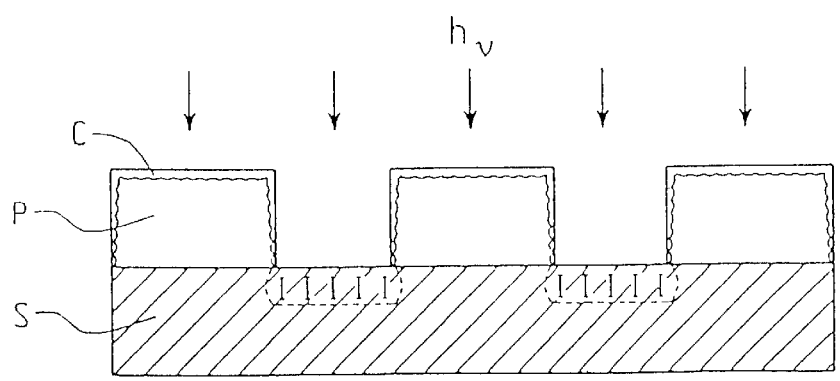

The present invention is directed to a process for stripping a photoresist layer after exposure to an ion implantation process. The process includes subjecting a substrate having ion implanted photoresist thereon to a UV radiation exposure and subsequently removing the ion implanted photoresist by conventional stripping processes. The selected stripping process, wet or dry, then breaks through the crust portion of the photoresist layer more quickly than in the case of an ion implanted photoresist layer that has not been exposed to UV radiation. As a result, removal efficiency for the selected stripping process increases. Thus, in the case of dry stripping, more commonly referred to as ashing, the present invention advantageously avoids the need for prolonged ash at low temperatures for removal of the ion implanted photoresist layer. Moreover, the inventors have found that with dry stripping, and in particular crust ashing processes, the temperatures used during ashing can be increased, resulting in faster throughputs with minimal or no blistering and/or popping. As previously noted, the inventive process is amenable to both wet and dry stripping processes.

Referring now to FIG. 1, there is shown a process flow diagram for removing ion implanted photoresist in accordance with the present invention. The first step (a) involves coating the photoresist onto a substrate, generally designated P and S respectively. Photoresists are generally organic photosensitive films used for transfer of images to an underlying substrate and are typically cast as a liquid coating. The liquid photoresist coating is applied to the substrate such as by spinning, dipping, roller coating or other conventional techniques. The present invention is generally applicable to those photoresists used in g-line, i-line, DUV, 193 nm, and 157 nm applications and subsequently exposed to an ion implantation process. This includes, but is not limited to, photoresist resins comprised of novolaks, polyvinylphenols, acrylates, acetals, ketals, polyimides, cyclic olefins or the like. Other suitable photoresist resins and materials will be apparent to those skilled in the art in view of this disclosure. The photoresist may be positive acting or negative acting depending on the photoresist chemistries and developers chosen.

The photoresist is coated onto substrates conventionally used in processes involving coating with photoresists and subsequent exposure to ion implantation. For example, the photoresist may be applied over silicon or silicon dioxide wafers for the production of microprocessors and other integrated circuit components. Aluminum-aluminum oxide, gallium arsenide, ceramic, quartz or copper substrates may also be employed. Other substrates suitable for use in the present invention will be apparent to those skilled in the art in view of this disclosure.

After the photoresist is coated onto the substrate, the photoresist P is patterned using conventional photolithography techniques as shown in step (b). Typically, those skilled in the art will selectively image the photoresist layer with activating radiation through a mask. The exposure is sufficient to effectively activate a photoactive component in the photoresist layer to produce a change in the dissolution properties between the exposed and unexposed areas. The photoresist layer is subsequently developed in accordance with art recognized procedures to obtain a relief image. Following development of the photoresist coating over the substrate, the developed substrate may be selectively processed on those areas bared of photoresist including, among others, an ion implantation process.

In step (c), the substrate is exposed to an ion implantation process. Energetic dopant ions, generally designated I, are accelerated towards the substrate and selectively implanted into exposed surfaces of the substrate, i.e., where there is no photoresist mask, to impart the desired electrical properties into the substrate. Depending on the desired electrical properties, the ions can be positive or negative. Selection of the dopant ions as well as the operating parameters utilized for ion implantation process are well within the skill of those in the art. For example, dopant ions include, but are not limited to arsenic containing dopant ions, boron containing dopant ions, and phosphorous containing dopant ions. In those areas of the substrate having the photoresist mask, the dopant ions react with a surface of the photoresist and are prevented from penetrating into the surface of the substrate. The portion of the photoresist that reacts with the dopant ions undergoes a chemical change wherein this portion is commonly referred to in the industry as a "crust", generally designated C in FIG. 1. The crust portion is hereinafter defined as the portion of the photoresist layer that reacts with the dopant ions resulting in a change of its removal and/or dissolution properties. Accordingly, the crust will be the surfaces of the photoresist exposed to and reacted with the dopant ions. The degree of ion penetration into the surfaces of the photoresist is limited and while not wanting to be bound by thereby is believed to be dependent on the operating parameters for the ion implantation process, the components of the photoresist, and a free volume of the photoresist layer. As noted, the ion implanted photoresist has different stripping properties compared to photoresist that is not exposed to the dopant ions. As a result, and as is known in the art, the ion implanted portion of the photoresist, i.e., crust portion, makes the photoresist layer more difficult to remove or strip. Various studies have shown the crust portion to be a highly carbonized, graphite-like layer.

As shown in step (d), the process further includes exposing the substrate including the ion implanted surfaces of the photoresist mask to a UV radiation exposure. Preferably, the entire surface of the substrate is exposed to UV radiation. The amount of UV radiation is from about 10 mJ/cm$^2$ to about 100 J/cm$^2$. Preferably, at least 100 mj/cm$^2$ is used. The wavelengths of the UW radiation are from about 150 nm to about 450 nm. More preferably, the wavelength of radiation is from about 200 nm to about 400 nm. The total exposure time is dependent on a variety of factors including, but not limited to, the wavelength and amount of radiation used. Optimization of the exposure is well within the skill of those in the art in view of this disclosure. Optionally, the wafer may be heated in a temperature range from about 20° C. to about 120° C. to increase the effectiveness of the UV radiation exposure. In the event the wafer is heated during UV radiation exposure, it is preferred that the wafer is heated to a temperature not greater than the bake temperature used prior to the ion implantation.

While not wanting to be bound by theory, it is believed that the UV radiation exposure causes photochemical rearrangements in the underlying bulk photoresist which, in turn, causes an increase in the removal efficiency of the ion implanted photoresist layer. The rate for removal of the ion implanted photoresist layer including the crust portion by conventional stripping processes, wet or dry, increases relative to the rate for removal of ion implanted photoresist layers that were not exposed to UV radiation. As such, wafer throughputs are increased. More importantly, the blistering and/or popping phenomena commonly observed during dry stripping processes is minimized or eliminated compared to dry stripping ion implanted photoresist that was not exposed to UV radiation. Advantageously, the inventors have found that, as a direct result of the UV radiation exposure, the temperatures used during dry stripping can be increased without causing a corresponding increase in the blistering or popping phenomena. The increase in temperature during dry stripping desirably increases wafer throughput.

Figure 1E:
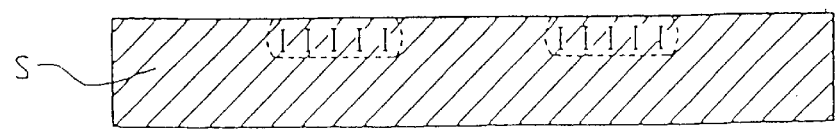

As shown FIG. 1(e), the process then includes a step wherein the photoresist is stripped from the substrate by conventional processes, such as by dry or wet stripping processes, generally known by those skilled in the art.

In the case of dry stripping, the substrates having ion implanted photoresist thereon are brought directly to a plasma asher wherein the substrates are UV exposed within the asher chamber and subsequently ashed. Alternatively, the UV exposure unit could be integrated with the ion implantation equipment or as a separate stand alone module. After UV radiation exposure, reactive species are formed in the chamber of the asher by generating a plasma. The invention is not intended to be limited to any particular plasma or plasma apparatus. The plasma may be oxygen containing or oxygen free, contain fluorine, forming gas and the like. Forming gas refers to a two-component gas mixture, wherein the first component is a hydrogen gas and the second component is a nitrogen gas or any of the noble gases such as helium, argon, etc. Other gas plasma compositions or apparatus suitable for use in the present invention will be apparent to those skilled in the art in view of this disclosure. The reactive species remove the ion implanted photoresist by reacting with the photoresist to form volatile reaction products or by weakening adhesion of the photoresist to the substrate. The stripping process continues until the volatile reaction products from the reaction between the photoresist are no longer evolved or the photoresist and/or residues are rendered removable by a rinse step The process may employ conventional monitoring equipment or the like.

Plasma asher devices suitable for use in the present invention include downstream plasma ashers, such as for example, those microwave plasma ashers available under the trade name GEMINI ES and commercially available from Eaton Corporation. However, it should be noted that the invention is not limited to any particular plasma asher in this or in the following embodiments. For instance, an inductively coupled plasma reactor can be used.

The particular components of the plasma gas are selected by their ability to form a gas and a plasma at plasma forming conditions. Preferably, the components are combined and added to the plasma asher as a gas. The plasma gas primarily reacts with carbon and other atoms in the photoresist compounds and/or residues to form volatile compounds at conditions present in a plasma reaction chamber. As noted, the plasma may be of the oxygen free type or contain oxygen. In addition, the plasma may contain fluorine depending on the stripping rate desired and the sensitivity of the other substrate components to fluorine.

Wet strippers include acids, bases and solvents as is known to those skilled in the art. After UV radiation exposure, the substrates are stripped by conventional means using the appropriate wet stripper. The particular wet strippers used are well within the skill of those in the art. For example, nitric acid, sulfuric acid, ammonia are commonly employed as wet strippers and are suitable for use in the present invention. In operation, the wet stripper is immersed, puddled, streamed, sprayed or the like onto the substrate and subsequently rinsed with deionized water.

Optionally, a rinsing step is employed after the wet or dry stripping step to remove contaminants and/or photoresist residuals. Preferably, the rinsing step employs deionized water but may also include ozone, sulfuric acid, hydrofluoric acid and the like, as is known in the art.

The following examples are detailed description of the processes for stripping ion implanted photoresist according to the present invention. The detailed process fall within the scope of, and serve to exemplify, the more generally described methods set forth above. The examples are presented for illustrative purposes only, and are not intended to limit the scope of the invention.

EXAMPLE 1

Figure 2:
FIG. 2 is a graph showing the time required for complete removal of ion implanted photoresist as monitored by the optical emission signal of hydroxy group functionality in the photoresist for wafers processed in accordance with the present invention and wafers that did not include a UV radiation exposure prior to ashing.

In this example, 200 mm silicon wafers were coated with 1.2 $\mu$m photoresist and subsequently implanted with phosphorous ions on an Eaton High Current Implanter. The dose was 5 $e^{15}$ atoms/cm$^2$ at an energy of 30 keV. The wafers were then exposed at 20° C. to 105 mW/cm$^2$ of ultraviolet radiation for 30 seconds on a Fusion Systems 200 PCU Photostabilizer. The wafers were then dry stripped, i.e., ashed, using Eaton's Fusion ES-AIM Asher at a temperature of 100° C. using 1700 sccm $O_2$, 1100 sccm Forming Gas (3% $H_2$, 97% $He_2$), and 150 sccm $CF_4$ at 1.5 torr using 1.5 kW of microwave power. The time for complete removal of photoresist was recorded by monitoring the optical emission signal of an —OH (hydroxy) functionality and compared to wafers that did not receive any UV exposure prior to stripping, The results are graphically shown in FIG. 2. The stripping of wafers without exposure to UV radiation first exhibited an initial decrease in the emission signal followed by a rapid increase. The initial decrease and subsequent rapid increase is indicative of the ashing process breaking through the crust portion of the photoresist layer. In comparison, those wafers exposed to UV radiation exhibit an increase from the very beginning of the stripping process, suggesting a more efficient process. The recorded times for complete removal of photoresist by each process are shown in Table 1.

TABLE I

|  | UV Exposure Step | No UV Exposure Step |
|---|---|---|
| Ashing Time to Remove Photoresist | about 110 seconds | about 150 seconds |

The results clearly show that removal of ion implanted photoresist occurs at a much faster rate after a UV radiation exposure indicating that the UV exposure increased the removal rate of the ion implanted photoresist layer.

EXAMPLE 2

Figure 3:
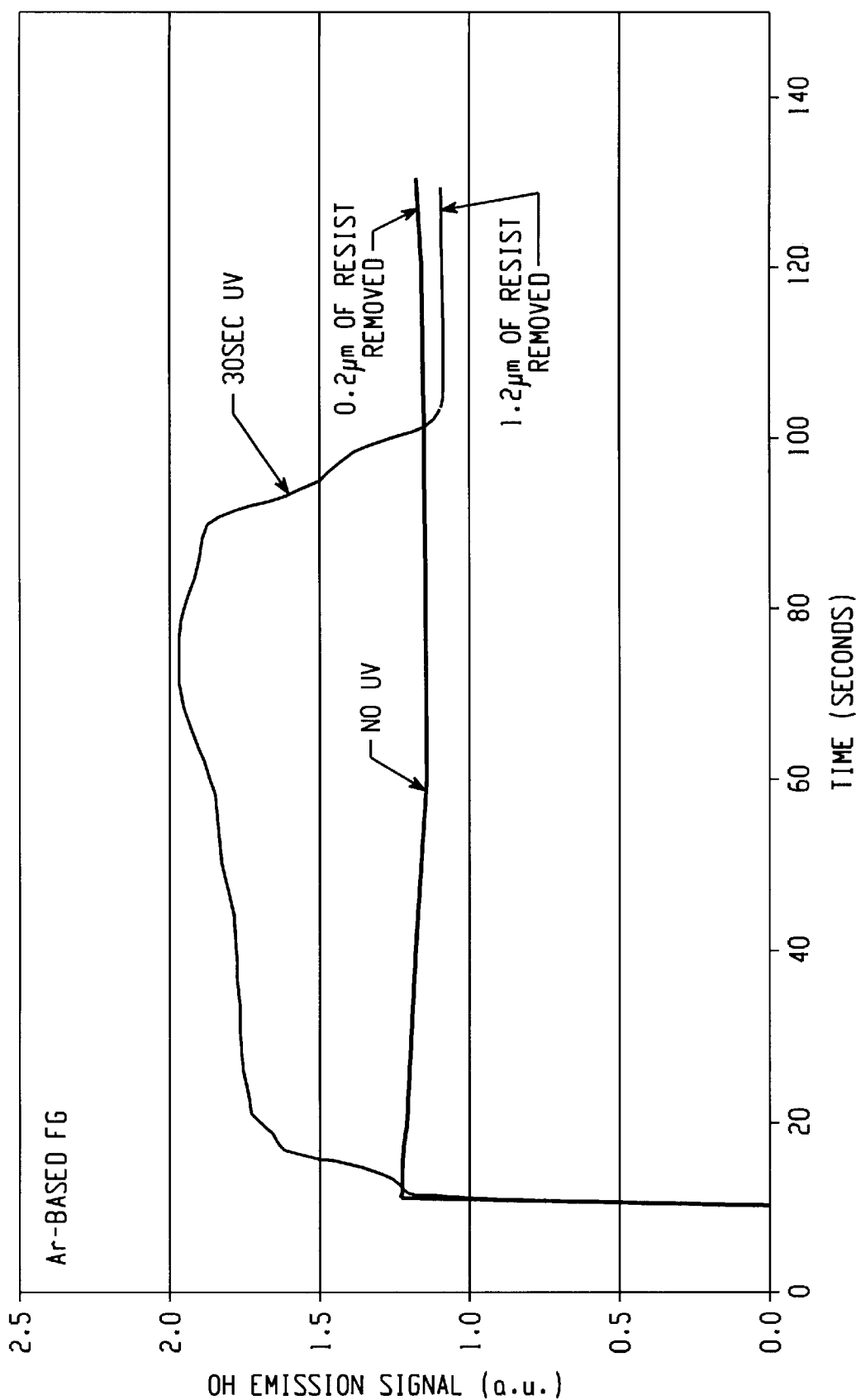
FIG. 3 is a graph showing the amounts of ion implanted photoresist removed under identical conditions for wafers processed in accordance with the present invention and wafers that did not include a UV radiation exposure prior to ashing.

In this example, 200 mm silicon wafers were coated with 1.2 $\mu$m of photoresist and subsequently implanted with phosphorous ions, treated and monitored as in Example 1. The forming gas used in this example was a gas mixture of 3% hydrogen and 97% argon. As noted in Example 1, the time for removal of photoresist from the UV irradiated wafers was recorded by monitoring the optical emission signal of the OH functionality in the photoresist. In this example, the wafers unexposed to UV radiation were ashed for the same amount of time as the UV irradiated wafers, wherein residual photoresist present on the wafer after ashing was measured by ellipsometry. The results are shown in FIG. 3. Under identical conditions, the wafers unexposed to UV radiation had about 1.0 μm of photoresist remaining on the wafer whereas the stripping process completely removed the photoresist from those wafers exposed to UV radiation.

Many modifications and variations of the invention will be apparent to those skilled in the art in light of the foregoing disclosure. Therefore, it is to be understood that, within the scope of the appended claims, the invention can be practiced otherwise than has been specifically shown and described.

What is claimed is:

1. A process for removing ion implanted photoresist supported by a substrate subsequent to ion treatment of the substrate comprising: a first step of exposing a substrate having an ion implanted photoresist layer thereon to an ultraviolet radiation source sufficient to render said ion implanted photoresist layer removable and, after discontinuing exposure to the radiation, a subsequent step of stripping the photoresist from the substrate.

2. The process according to claim 1 wherein the step of stripping consists of a selected one of a wet and dry stripping process.

3. The process according to claim 2 wherein the stripping is a dry stripping process and comprises exposing the ultraviolet exposed ion implanted photoresist layer to a plasma.

4. The process according to claim 3 wherein the plasma is generated from a gas that contains oxygen.

5. The process according to claim 3 wherein the plasma is generated from a gas mixture in the absence of oxygen.

6. The process according to claim 1 further comprising heating the substrate during the step of exposing the substrate to the ultraviolet radiation source.

7. The process according to claim 6 wherein the substrate is heated to a temperature from about 20° C. to about 120° C.

8. The process according to claim 6 wherein the substrate is heated to a temperature not greater than the maximum temperature the photoresist layer had been baked prior to an ion treatment of the substrate.

9. The process according to claim 1 wherein the ultraviolet radiation source emits radiation at a wavelength from about 150 nm to about 450 nm.

10. The process according to claim 1 wherein the ultraviolet radiation source emits radiation at a wavelength from about 200 nm to about 400 nm.

11. The process according to claim 1 wherein the step of exposing the substrate to the ultraviolet radiation source is at an exposure energy of from about 10 mJ/cm$^2$ to about 100 J/cm$^2$.

12. The process according to claim 1 wherein the step of exposing the substrate to the ultraviolet radiation source is at an exposure energy of at least 100 mJ/cm$^2$.

13. A process for removing photoresist from a semiconductor substrate that has been treated with ions, said process comprises the steps of:

forming a mask comprising photoresist on the substrate;
exposing the substrate to dopant ions, wherein the dopant ions react with a surface of the photoresist mask to form an ion implanted photoresist portion in the photoresist mask;
implanting the dopant ions through openings in the mask and into the substrate,
exposing the substrate to UV radiation in preparation of removing the photoresist mask from the substrate;
forming a reactive species by generating a plasma; and
after discontinuing exposure of the substrate to UV radiation, exposing the substrate to the reactive species of the plasma for a time sufficient and effective to remove the photoresist mask including the ion implanted photoresist portion from the substrate.

14. The process for removing ion implanted photoresist according to claim 13 wherein the step of exposing the substrate to UV radiation comprises an exposure energy of about 105 mW/cm$^2$.

15. The process for removing ion implanted photoresist according to claim 14 wherein the step of exposing the substrate to UV radiation comprises an exposure time of about 30 seconds.

16. The process for removing ion implanted photoresist according to claim 13 wherein the step of exposing the substrate to UV radiation further comprises heating the wafer to a temperature effective to increase a rate for removing the photoresist mask from the substrate, wherein the wafer is heated to a temperature not greater than the maximum temperature the photoresist layer had been baked prior to the ion implantation process step.

17. The process for removing ion implanted photoresist according to claim 13 wherein the step of exposing the substrate to UV radiation comprises an exposure of about 105 mW/cm2 for 30 seconds wherein the substrate is maintained at a temperature of about 20° C.

18. The process for removing ion implanted photoresist according to claim 13 wherein the plasma is free of oxygen.

19. The process for removing ion implanted photoresist according to claim 13 wherein the plasma contains oxygen.

20. The process for removing ion implanted photoresist according to claim 13 wherein the steps of exposing the ion implanted photoresist to UV radiation and the reactive species occur in the same reaction chamber.

21. The process for removing ion implanted photoresist according to claim 13 wherein the step of exposing the substrate to the UV radiation comprises exposing the substrate to an exposure energy from about 10 mJ/CM$^2$ to about 100 J/cm$^2$.

22. The process for removing ion implanted photoresist according to claim 13 wherein the step of exposing the substrate to the UV radiation comprises exposing the substrate to an exposure energy of at least 100 mJ/cm$^2$.

23. A process for removing ion implanted photoresist from a semiconductor substrate, said process comprises the steps of:

forming a mask comprising photoresist on the substrate;
exposing the substrate to dopant ions, wherein the dopant ions react with a surface of the photoresist mask to form an ion implanted photoresist portion in the photoresist mask;
implanting the dopant ions through openings in the mask and into the substrate,
exposing the substrate to UV radiation in preparation of removing the photoresist mask from the substrate;
forming a reactive species by generating a plasma;
after discontinuing exposure of the substrate to UV radiation, exposing the substrate to the reactive species of the plasma for a time sufficient and effective to remove the photoresist mask including the ion implanted photoresist portion from the substrate; and rinsing the substrate with deionized water.

24. A process for removing ion implanted photoresist from a semiconductor substrate, said process comprises the steps of:

forming a mask comprising photoresist on the substrate;

exposing the substrate to dopant ions, wherein the dopant ions react with a surface of the photoresist mask to form an ion implanted photoresist portion in the photoresist mask;

implanting the dopant ions through openings in the mask and into the substrate, exposing the substrate to UV radiation in preparation of removing the photoresist mask from the substrate;

forming a reactive species by generating a plasma; and after discontinuing exposure of the substrate to UV radiation, exposing the substrate to the reactive species of the plasma for a time sufficient and effective to remove the photoresist mask including the ion implanted photoresist portion from the substrate, wherein there is no inhibition evident during monitoring during the removal of the ion implanted photoresist portion.

25. A process for removing ion implanted photoresist from a semiconductor substrate, said process comprises the steps of:

forming a mask comprising photoresist on the substrate;

exposing the substrate to dopant ions, wherein the dopant ions react with a surface of the photoresist mask to form a hardened ion implanted photoresist portion in the photoresist mask;

implanting the dopant ions through openings in the mask and into the substrate, exposing the substrate to UV radiation, whereby said exposure to radiation increases a break through rate of the hardened ion implanted photoresist portion of the substrate when exposed to a reactive species generated by a plasma;

forming a reactive species by generating a plasma; and after discontinuing exposure of the substrate to UV radiation, exposing the substrate to the reactive species of the plasma for a time sufficient and effective to remove the photoresist mask including the ion implanted photoresist portion from the substrate.

26. The process for removing ion implanted photoresist according to claim 25 wherein the step of exposing the substrate to UV radiation comprises an exposure energy of about 105 mW/cm$^2$.

27. The process for removing ion implanted photoresist according to claim 26 wherein the step of exposing the substrate to UV radiation comprises an exposure time of about 30 seconds.

28. The process for removing ion implanted photoresist according to claim 25 wherein the step of exposing the substrate to UV radiation further comprises heating the wafer to a temperature effective to increase a rate for removing the photoresist mask from the substrate, wherein the wafer is heated to a temperature not greater than the maximum temperature the photoresist layer had been baked prior to the ion implantation process step.

29. The process for removing ion implanted photoresist according to claim 25 wherein the step of exposing the substrate to UV radiation comprises an exposure of about 105 mW/cm2 for 30 seconds wherein the substrate is maintained at a temperature of about 20° C.

30. The process for removing ion implanted photoresist according to claim 25 wherein the plasma is free of oxygen.

31. The process for removing ion implanted photoresist according to claim 25 wherein the plasma contains oxygen.

32. The process for removing ion implanted photoresist according to claim 25 wherein the steps of exposing the ion implanted photoresist to UV radiation and the reactive species occur in the same reaction chamber.

33. The process for removing ion implanted photoresist according to claim 25 wherein the step of exposing the substrate to the UV radiation comprises exposing the substrate to an exposure energy from about 10 mJ/cm$^2$ to about 100 J/cm$^2$.

34. The process for removing ion implanted photoresist according to claim 25 wherein the step of exposing the substrate to the UV radiation comprises exposing the substrate to an exposure energy of at least 100 mJ/cm$^2$.

35. A process for removing ion implanted photoresist from a semiconductor substrate, said process comprises the steps of:

forming a mask comprising photoresist on the substrate;

exposing the substrate to dopant ions, wherein the dopant ions react with a surface of the photoresist mask to form an ion implanted photoresist portion in the photoresist mask;

implanting the dopant ions through openings in the mask and into the substrate, exposing the substrate to UV radiation in preparation of removing the photoresist mask from the substrate;

forming a reactive species by generating a plasma; and after discontinuing exposure of the substrate to UV radiation, exposing the substrate to the reactive species of the plasma for a time sufficient and effective to remove the photoresist mask including the ion implanted photoresist portion from the substrate, wherein the plasma is free of oxygen and no oxidizing fluid is used in the removal process such that said process is performed in an essentially oxygen-free environment.

36. The process for removing ion implanted photoresist according to claim 35 wherein the step of exposing the substrate to UV radiation comprises an exposure energy of about 105 mW/cm$^2$.

37. The process for removing ion implanted photoresist according to claim 35 wherein the step of exposing the substrate to UV radiation further comprises heating the wafer to a temperature effective to increase a rate for removing the photoresist mask from the substrate, wherein the wafer is heated to a temperature not greater than the maximum temperature the photoresist layer had been baked prior to the ion implantation process step.

38. The process for removing ion implanted photoresist according to claim 35 wherein the step of exposing the substrate to UV radiation comprises an exposure of about 105 mW/cm2 for 30 seconds wherein the substrate is maintained at a temperature of about 20° C.

39. The process for removing ion implanted photoresist according to claim 35 wherein the steps of exposing the ion implanted photoresist to UV radiation and the reactive species occur in the same reaction chamber.

40. The process for removing ion implanted photoresist according to claim 35 wherein the step of exposing the substrate to the UV radiation comprises exposing the substrate to an exposure energy from about 10 mJ/cm$^2$ to about 100 mJ/cm$^2$.

41. The process for removing ion implanted photoresist according to claim 13 wherein the step of exposing the substrate to the UV radiation comprises exposing the substrate to an exposure energy of at least 100 mJ/cm$^2$.

42. A process for removing ion implanted photoresist from a semiconductor substrate, said process comprises the steps of:

forming a mask comprising photoresist on the substrate;

exposing the substrate to dopant ions, wherein the dopant ions react with a surface of the photoresist mask to form an ion implanted photoresist portion in the photoresist mask;

implanting the dopant ions through openings in the mask and into the substrate, exposing the substrate to UV radiation in preparation of removing the photoresist mask from the substrate;

forming a reactive species by generating a plasma; and after discontinuing exposure of the substrate to UV radiation, exposing the substrate to the reactive species of the plasma for a time sufficient and effective to remove the photoresist mask including the ion implanted photoresist portion from the substrate, wherein the steps of exposing the ion implanted photoresist to UV radiation and the reactive species occur in the same reaction chamber.

43. A process for removing ion implanted photoresist from a semiconductor substrate, said process comprises the steps of:

forming a mask comprising photoresist on the substrate;

exposing the substrate to dopant ions, wherein the dopant ions react with a surface of the photoresist mask to form an ion implanted photoresist portion in the photoresist mask;

implanting the dopant ions through openings in the mask and into the substrate, exposing the substrate to UV radiation in preparation of removing the photoresist mask from the substrate;

forming a reactive species by generating a plasma; and after discontinuing exposure of the substrate to UV radiation, exposing the substrate to the reactive species of the plasma for a time sufficient and effective to remove the photoresist mask including the ion implanted photoresist portion from the substrate;

wherein the step of exposing the substrate to UV radiation comprises an exposure energy of less than 150 mW/cm$^2$.

\* \* \* \* \*